United States Patent [19]

Bourdillot et al.

[11] Patent Number: 4,532,699
[45] Date of Patent: Aug. 6, 1985

[54] PROCESS FOR MANUFACTURING A MATRIX INFRARED DETECTOR WITH ILLUMINATION BY THE FRONT FACE

[75] Inventors: Michel Bourdillot, Chasseneuil Du Poitoux; André Gauthier, Paris; Jacques Maillé, Paris; Bernard Pitault, Paris, all of France

[73] Assignee: Societe Anonyme de Telecommunications, France

[21] Appl. No.: 555,163

[22] Filed: Nov. 25, 1983

[30] Foreign Application Priority Data

Nov. 30, 1982 [FR] France .................. 82 20031

[51] Int. Cl.³ .................. H01L 21/302; H01L 21/31
[52] U.S. Cl. .................. 29/572; 29/580; 29/590; 29/591; 357/56
[58] Field of Search .................. 29/572, 580, 591, 590; 357/30, 56, 76; 156/649; 204/38 B, 192 C; 427/91

[56] References Cited

U.S. PATENT DOCUMENTS

| | | | |
|---|---|---|---|
| 3,746,587 | 7/1973 | Rosvold | 357/56 |
| 3,832,246 | 8/1974 | Lynch | 29/572 |
| 4,037,311 | 7/1977 | Blackman et al. | 29/572 |
| 4,142,893 | 3/1979 | Adlerstein et al. | 156/649 |
| 4,339,870 | 7/1982 | Ball et al. | 156/649 |
| 4,376,663 | 3/1983 | Wang et al. | 29/572 |
| 4,391,678 | 7/1983 | Freeman | 204/38 B |

FOREIGN PATENT DOCUMENTS 18476 2/1981 Japan .................. 29/572

*Primary Examiner*—Brian E. Hearn
*Assistant Examiner*—Hunter L. Auyang
*Attorney, Agent, or Firm*—Jacobs & Jacobs

[57] ABSTRACT

A parallelepipedic detection wafer of type p made of Hg Cd Te is taken, islets or raised zones are formed from the front face and their structure is rounded, zones of type n are diffused from the front face, in order to form junctions, metallic contact terminals are formed from the front face up to the bottom level of the raised zones, the detection wafer is thinned from the rear face, the terminals are isolated, the pieces of raised zones are attached by the rear face on a processing wafer and the terminals are welded on metallization zones of the processing wafer. The invention enables an infrared detector for camera to be manufactured.

9 Claims, 10 Drawing Figures

PROCESS FOR MANUFACTURING A MATRIX INFRARED DETECTOR WITH ILLUMINATION BY THE FRONT FACE

BACKGROUND OF THE INVENTION

The present invention relates to a matrix infrared detector comprising a matrix of infrared elements, particularly for a camera, for example for aerial reconnaissance.

The advantage of such matrix detectors lies in the fact that the elements of the matrix are addressed, or scanned, electronically, and no longer mechanically by luminous spot.

Addressing consists, in fact, with the aid of electronic processing means, either in integrating the signals delivered by the elements of the matrix, or in sequentially switching the elements of the matrix on a circuit for reading the signals delivered. It will therefore be appreciated that each of the elements of the matrix is connected to these electronic processing means.

It has already been proposed to couple the elements of the matrix to electronic circuits for processing by lines. However, this solution presents drawbacks due to the length of the connecting lines, in which parasitic noises are generated, and to their number which provokes a heat load due to the line losses. Furthermore, this solution leads to detection modules of considerable dimensions, with a large number of elementary welds.

It was then proposed to manufacture a matrix infrared detector by taking a first semiconductor wafer of one of two types p and n, previously cut out, by diffusing zones of the other of the two types, from the front face of the wafer to be illuminated, to define junctions and to form a matrix of elementary detectors, by disposing the first detection wafer on a second semiconductor wafer adapted to process the signals delivered by the elementary detectors of the matrix of the first wafer, and by forming, on the front face of the detection wafer, on one of the walls thereof connecting its front face and the face of the second processing wafer facing the detection wafer, and on this face of the processing wafer, metallic contact terminals connecting said zones of the detection wafer to associated metallization zones of the processing wafer.

Such a process of manufacture already presents the advantage of being able to form the connecting terminals collectively in one operation.

However, this process presents the drawback whereby, before these connecting terminals are made, the two detection and processing wafers must already be one on the other. This results in a risk of misalignment of the connecting terminals and the metallization zones of the processing wafer. There is also a risk of electrical discontinuity due to the structural discontinuity at the joint between the two wafers, generally constituted by adhesive.

SUMMARY OF THE INVENTION

It is an object of the present invention to overcome these drawbacks.

To this end, the present invention relates to a process for manufacturing a matrix infrared detector with illumination by the front face, characterized by the steps of taking a first semiconductor wafer of one of two types p and n; forming thereon, from the front face to be illuminated, a relief in the form of islets or raised zones; diffusing, from the top level of the relief, zones of the other of the two types in order to define junctions and to form a matrix of elementary detectors; forming metallic contact terminals on the top level of the relief, from the zones of the other of the two types, on at least one of the walls of the relief connecting the top and bottom levels and on the bottom level of the relief of the detection wafer, on the side of said wall; thinning the detection wafer from its rear face opposite the one to be illuminated, up to the bottom level of the relief, to clear the contact terminals; disposing the thinned detection wafer, by its rear face, on a second semiconductor wafer adapted to process the signals delivered by the elementary detectors of the matrix of the detection wafer, and connecting said contact terminals to associated metallization zones of the processing wafer.

In this way, and thanks to the invention, the formation of the connecting terminals in the "grooves", at the bottom level of the relief in islet form, of the detection wafer, does not raise any difficulty since the structure is continuous and any risk of electrical interruption is therefore eliminated. In addition, a perfect alignment of the connecting terminals and the metallization zones of the processing wafer may be effected without difficulty.

Finally, the process of manufacture according to the invention is rapid and economical with no degradation of the material constituting the detection wafer.

In a preferred embodiment of the process of the invention, the contact terminals are formed by one of the two processes of thermal evaporation or of cathode sputtering, before they are enlarged by the electrolytic process.

BRIEF DESCRIPTION OF THE DRAWINGS

The invention will be more readily understood on reading the following description with reference to the accompanying drawings, in which.

DETAILED DESCRIPTION OF A PREFERRED EMBODIMENT OF THE INVENTION

Figure 1:
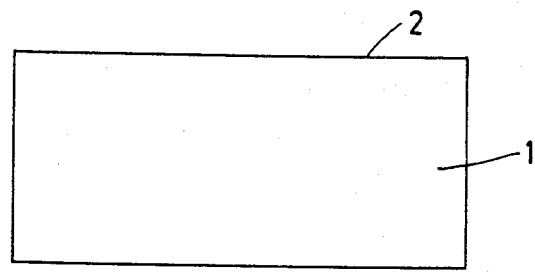
FIGS. 1 to 9 show in schematic section a detection wafer in its different phases of manufacture and assembly on a processing wafer, according to the process of the invention.
Figure 2:
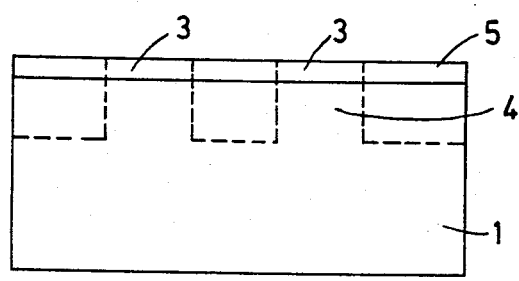
Figure 3:
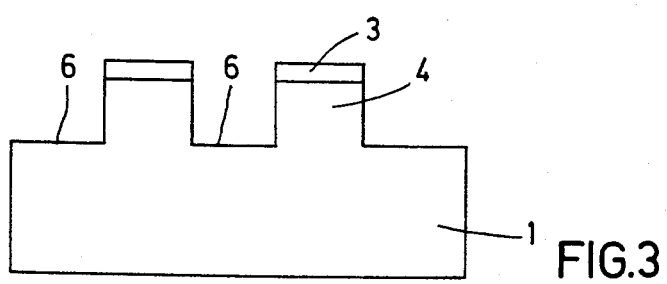
Figure 4:
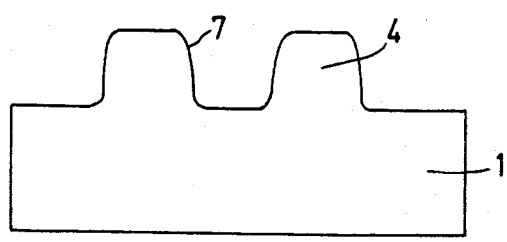
Figure 5:
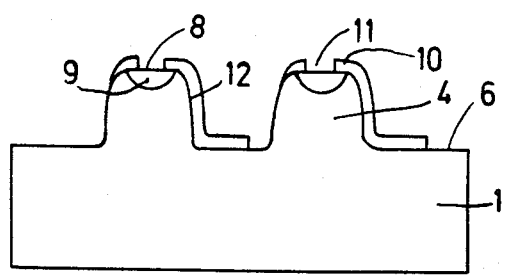
Figure 6:
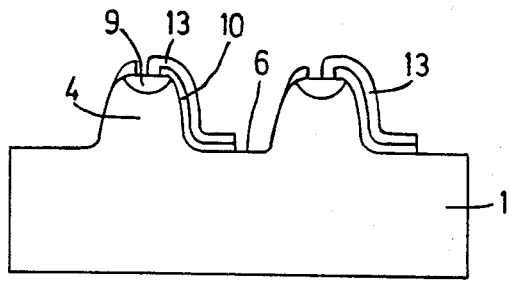

The different phases of the process for manufacturing a matrix infrared detector with illumination by the front face, for example by the planar process, will now be described.

A solid substrate 1 is taken, for example of Hg Cd Te, which is a semiconductor material particularly suitable for the detection of objects or landscapes in the spectral bands of 3 to 5 $\mu$m and of 8 to 12 $\mu$m, althrough the invention is not limited to such a material. The substrate 1 is more precisely of type p, althrough a substrate of type n might equally well have been taken. The substrate 1 is, at the start, in the form of a wafer about 1 mm thick in the case in question.

The substrate 1 is polished and subjected to chemical attack in order to obtain perfectly flat walls and a good physico-chemical surface state.

A layer 5 of photosensitive resin is then deposited on the whole upper, or front, face 2 of the wafer 1, the one intended to be illuminated, then a mask provided with windows regularly spaced apart in the desired pattern is applied thereon and is insolated with ultraviolet rays in order to polymerize the resin, in the present case negative, level with the windows and thus to form reserve islets or raised zones 3 having to resist attacking agents, and corresponding to zones in relief 4 to be conserved.

The substrate 1 is attacked from the layer of resin 5 until a structure in relief is obtained which presents islets or raised zones 4 and grooves 6 between zones 4. The height of the zones 4 may advantageously be between 30 and 50 μm. Attack may be effected by ionic abrasion or by a chemical process, for example with a solution of pure bromine and alcohol.

After this cut-out, the reserve zones 3 are eliminated with the aid of the appropriate solvent.

A light polishing is then effected in order to soften the structure of the raised zones 4 and to round their edges 7.

After having deposited a masking layer 10 made of dielectric material on the upper face 8 of the raised zones 4, over one of their more or less vertical walls 12 connecting their top and bottom levels, and over part of the grooves 6 adjacent the walls in question, and having opened diffusion windows 11 in this layer 10 in the upper part of the raised zones 4, for example by chemical attack, a diffusion of n type is effected, from these windows, from face 8, in order to obtain zones 9 of n type. Of course, if a substrate of n type had been taken at the start, a diffusion of p type would then have been effected.

In this way, a series, or rathermore a mosaic, of elementary photodiodes created by the zones 9 of n type in the substrate 1 of p type of the raised zones 4 is thus obtained.

Fine metal strips 13, with a thickness of some thousands of Å, are then deposited through a mask on the non-conductor 10 and from zones 9, said strips therefore extending on one side of the raised zones 4 from zone 9 to the corresponding groove 6. This deposit may be effected either by thermal evaporation or by cathode sputtering. The substrate 1 is then immersed in a bath of electrolyte in order to enlarge the metal strips previously deposited, by passing a current through the metal strips and the mass p of the substrate, until contact terminals 13 some μm thick are obtained.

Thanks to the rounded edges of the raised zones 4, the contact terminals 13 are deposited without risk of electrical discontinuity.

The wafer is then thinned and the contact terminals 13 are isolated.

To this end, the wafer 1 is firstly stuck by its active upper face presenting the structure in relief, on a support plate 14, for example of glass, by means for example of wax 15. The plate 14 ensures mechanical protection of the active face of the wafer and holds and positions the wafer during the operations of thinning and isolation of the contact terminals.

The wafer is then thinned, from its rear face 16 opposite that intended to be illuminated, in order to reduce the total thickness of the wafer 1 of 1 mm to about 70 to 100 μm, by known means, for example by mechanical or mechano-chemical lapping or polishing.

Finally, still proceeding from the rear face, the terminals 13 are isolated by attacking the substrate up to these terminals, although not including the latter but including the layer 10.

Attack of the agents must therefore be selective with respect to the terminals. This attack may be effected by ionic abrasion; in that case, abrasion will be stopped just after the attack of the non-conductive layer 10. This attack may also be effected by the chemical process; in that case, if the terminals are made of gold for example, the attacking agent may be a solution of pure bromine and alcohol.

Figure 7:
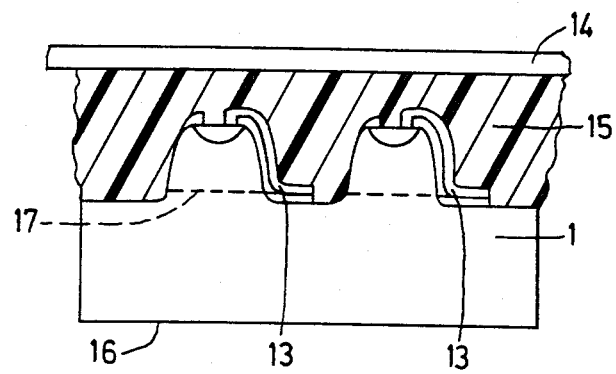
Figure 8:
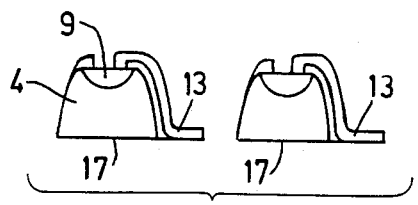
Figure 9:
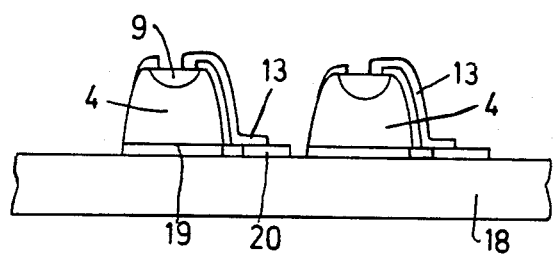
Figure 10:
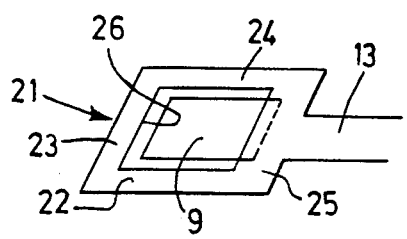
FIG. 10 shows a view in perspective of the anchoring on the detection wafer of a contact terminal of the detector manufactured according to the process of the invention.

A wafer is thus obtained whose thickness is substantially the same as the raised zones 4 previously cut out, extending between level 17, corresponding substantially to that of the grooves 6 which have now disappeared and shown in broken lines in FIG. 7, apart from the thickness of the layer 10 projecting from the associated raised zone, also attacked, and the upper face intended to be illuminated.

It then remains, after the separation of the raised zones, to mount the thinned wafer 1, or more exactly the different pieces of raised zones thus cut out, on another processing wafer 18 by its rear face 17 and for example by adhesion 19, and to connect the terminals 13, preformed and integrated in the detection wafer, collectively to the processing wafer 18 and more precisely to associated metallization zones 20, by their tabs projecting from the raised zones 4, all at the same level as the zones 20 and thus to transfer the contacts n on the processing wafer. The wafer 18 adapted to process the signals delivered by the detectors of the matrix of the detection wafer is preferably made of silicon, but the invention is not limited to this material.

Adhesion of the detection wafer on the processing wafer 18 may be effected with the aid of a conducting glue 19. In this case, the contact of type p of the detection wafer is directly transferred on the processing wafer 18. If a non-conducting adhesive is used, contact p of the detection wafer is transferred on the processing wafer in the same way as contacts n.

The connection of the projecting tabs of terminals 13 of the detection wafer to the associated metallization zones 20 of the processing wafer 18, for example constituted by a deposit of gold or aluminium, may be effected for example by welding, either by ultrasonic welding or by thermocompression using a welding tool adapted to the pattern of the mosaic of elementary detectors.

it will be noted that the contact terminals 13 are of such length that they descend along the walls of the raised zones and extend therebeyond, projecting from these raised zones by a length necessary for making the contact on the associated zone 20 of the processing circuit of the wafer 18.

The invention is, of course, applicable to any configuration of mosaic or matrix of elementary detectors.

It will also be noted that, during clearing of the contact terminals 13, the structure of the raised zones 4 avoids any risk of infiltration of the attacking agent towards the photodiodes and the terminals themselves are not damaged due to their electrolytic reinforcement.

Integration of the contact terminals 13 of the elementary detectors of the detection wafer according to the invention is effected by forming each of the terminals from at least one part of the associated n zone 9. To improve integration of the terminals, or anchoring of the terminals, integration is effected by a closed border 21 of generally rectangular form, presenting three sides 22, 23, 24 of a certain width, integrated with the substrate of p type, outside the associated n zone 9, and a widened side 25 in contact with n zone 9 and extending at 13, towards the outside of the wafer, the sides of the border 21 forming an illumination window 26 substantially level with the n zone 9 of the corresponding junction.

What is claimed is:

1. A process for manufacturing a matrix infrared detector with illumination on a front face, which comprises providing a first semi-conductor wafer of one conductivity type, p or n, and forming thereon, from the front face to be illuminated, a relief in the form of islets or raised zones having top and bottom levels and side walls connecting said top and bottom levels; depositing a dielectric layer on said relief zones, opening a window in said dielectric layer, using said dielectric layer as a diffusion mask and as an insulating layer for a subsequently deposited metallization layer, diffusing through said window a dopant into the top level of the relief zones to form regions of an opposite conductivity type in order to define junctions and to form a matrix of elementary detectors; forming, in one step, a metallic connection on each said relief zone that extends from said region of an opposite conductivity type on said top level of said relief zone and thence over at least one of said side walls of said relief zone and thence to the bottom level of said relief zone adjacent said one side wall; thinning the wafer from its rear face up to the ottom level of the relief zone and isolating the contact terminals; disposing the thinned wafer, by its rear face, on a second semi-conductor processing wafer adapted to process the signals delivered by the elementary detectors of the wafer; and connecting said contact terminals to associated metallization zones of the processing wafer.

2. The process of claim 1, wherein the contact terminals are firstly formed by one of the two processes of thermal evaporation and cathode sputtering process, before being enlarged by the electrolytic process.

3. The process of claim 1, wherein the structure of the raised zones is rounded after they have been formed.

4. The process of claim 1, wherein, before the wafer is thinned, it is glued by its front face on a support plate.

5. The process of claim 1, wherein the detection wafer is thinned by mechanical means.

6. The process of claim 1, wherein the contact terminals are isolated by a chemical process.

7. The process of claim 1, wherein the contact terminals are isolated by ionic abrasion.

8. The process of claim 1, wherein the detection wafer is disposed on the processing wafer by adhesion.

9. The process of claim 1, wherein the wafer is composed of Hg Cd Te.

* * * * *